United States Patent
An et al.

(10) Patent No.: US 7,940,115 B2
(45) Date of Patent: May 10, 2011

(54) FUSE CIRCUIT FOR SEMICONDUCTOR INTEGRATED CIRCUIT AND CONTROL METHOD OF THE SAME

(75) Inventors: Sun-Mo An, Ichon (KR); Shin-Ho Chu, Ichon (KR)

(73) Assignee: Hynix Semiconductor Inc. (KR)

( * ) Notice: Subject to any disclaimer, the term of this patent is extended or adjusted under 35 U.S.C. 154(b) by 50 days.

(21) Appl. No.: 12/333,181

(22) Filed: Dec. 11, 2008

(65) Prior Publication Data

US 2009/0230986 A1  Sep. 17, 2009

(30) Foreign Application Priority Data

Mar. 12, 2008 (KR) .................. 10-2008-0022759

(51) Int. Cl.
  *H03K 17/22* (2006.01)
  *H03K 19/20* (2006.01)
(52) U.S. Cl. .......................... 327/525; 326/38
(58) Field of Classification Search .............. 327/525
See application file for complete search history.

(56) References Cited

U.S. PATENT DOCUMENTS

| | | | | |
|---|---|---|---|---|
| 4,918,663 A * | 4/1990 | Remington et al. | ........... | 365/226 |
| 6,157,227 A * | 12/2000 | Giovinazzi et al. | ........... | 327/143 |
| 6,542,425 B2 * | 4/2003 | Nam | ............... | 365/222 |
| 6,570,804 B1 | 5/2003 | Blodgett | | |
| 6,778,459 B2 | 8/2004 | Blodgett | | |
| 6,992,942 B2 * | 1/2006 | Ito | .................. | 365/222 |
| 7,091,768 B2 * | 8/2006 | Lee | ................ | 327/525 |
| 7,129,768 B2 | 10/2006 | Yoon | | |
| 7,265,595 B1 * | 9/2007 | Kutz et al. | ...................... | 327/143 |
| 7,459,957 B2 * | 12/2008 | Kim et al. | ..................... | 327/525 |
| 7,525,368 B2 * | 4/2009 | Shih | .............................. | 327/525 |
| 7,586,350 B2 * | 9/2009 | Chung et al. | .................... | 327/198 |
| 2006/0125548 A1 | 6/2006 | Kitayama et al. | | |

FOREIGN PATENT DOCUMENTS

| | | |
|---|---|---|
| JP | 2006172585 | 6/2006 |
| KR | 1020020058525 | 7/2002 |
| KR | 1020030002153 A | 1/2003 |
| KR | 1020070058879 | 6/2007 |

* cited by examiner

*Primary Examiner* — Lincoln Donovan
*Assistant Examiner* — Terry L Englund
(74) *Attorney, Agent, or Firm* — Baker & McKenzie LLP

(57) ABSTRACT

A fuse circuit for a semiconductor integrated circuit includes a control unit configured to activate a fuse set control signal in response to an external command signal, and a plurality of fuse sets, each configured so that power is supplied to internal fuses in response to the activation of the fuse set control signal.

10 Claims, 2 Drawing Sheets

FUSE CIRCUIT FOR SEMICONDUCTOR INTEGRATED CIRCUIT AND CONTROL METHOD OF THE SAME

CROSS-REFERENCES TO RELATED APPLICATION

The present application claims priority under 35 U.S.C. §119(a) to Korean application number 10-2008-0022759, filed on Mar. 12, 2008, in the Korean Intellectual Property Office, which is incorporated herein by reference in its entirety as if set forth in full.

BACKGROUND

1. Technical Field

The embodiments described herein relate to a semiconductor integrated circuit, and more particularly, to a fuse circuit for a semiconductor integrated circuit and a control method thereof.

2. Related Art

In general, a semiconductor integrated circuit is subjected to various tests for evaluating operational reliability. The tests include operational tests for monitoring the input/output and operational state of the semiconductor integrated circuit according to external command signals. In addition, physical testing of the semiconductor integrated circuit is performed for monitoring the ability to adapt to changes in physical environments regardless of command signal execution.

A highly accelerated temperature and humidity stress test (HAST) is one of the physical tests and evaluates operational reliability in high temperature and humidity environments of the semiconductor integrated circuit. For example, the temperature and humidity stress tests create high temperature and humidity environments with a humidity of about 80% to 90% and a temperature of 125° C. to accelerate moisture penetration through a package joint part while supply voltages VDD and VSS to the semiconductor integrated circuit.

Many semiconductor integrated circuits include significant numbers of fuse sets for changing test or operational conditions during a manufacturing process of the semiconductor integrated circuit.

FIG. 1 is a schematic block diagram of conventional fuse sets. In FIG. 1, a plurality of fuse sets 10 are reset according to a power-up signal 'PWRUP' and perform a normal signal output according to whether a fuse is cut when an electric power is supplied after the reset is performed. Here, the fuse may be formed of metal or non-metal material(s). However, characteristics of a metal material can greatly effect the resistance of the metal due to chemical reactions, such as an ionization phenomenon, in high temperature and humidity environmental conditions, as in the temperature and humidity stress test. Since the fuse is formed of a metal, an increase in resistance may result from the chemical reactions when the temperature and humidity stress test is performed. Accordingly, normal operation of the fuse may be adversely effected.

The power-up signal 'PWRUP' is activated when the voltage VDD exceeds a predetermined level, wherein the fuse set operates according to the power-up signal 'PWRUP'. Accordingly, the power-up signal 'PWRUP' is activated as the voltage VDD is supplied when the temperature and humidity stress test is performed, whereby the voltage VDD is supplied to the metal fuse of the fuse set 10.

As a result, when the fuse of the fuse set 10 is connected while the temperature and humidity stress test is performed, the resistance of the fuse may abnormally increase, thereby causing a current leakage path and problems, such as a fault of a current standard (IDDP2), for a semiconductor integrated circuit. Since a plurality of the fuse sets is provided inside a semiconductor integrated circuit, the current standard (IDDP2) fault problem becomes more critical.

SUMMARY

A fuse circuit for a semiconductor integrated circuit and a control method thereof capable of preventing malfunction when a test is performed on the semiconductor integrated circuit are described herein.

In one aspect, a fuse circuit for a semiconductor integrated circuit includes a control unit configured to activate a fuse set control signal in response to an external command signal, and a plurality of fuse sets, each configured so that power is supplied to internal fuses in response to the activation of the fuse set control signal.

In another aspect, a fuse circuit for a semiconductor integrated circuit includes a control unit configured to determine whether a physical test is being performed to activate a fuse set control signal, and a plurality of fuse sets, each configured so that power is supplied to internal fuses in response to activation of the fuse set control signal.

In another aspect, a control method of a fuse circuit for a semiconductor integrated circuit includes determining an operational mode of the semiconductor integrated circuit, and interrupting power supply to fuses provided inside the fuse circuit when the operational mode of the semiconductor integrated circuit includes a physical test mode.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
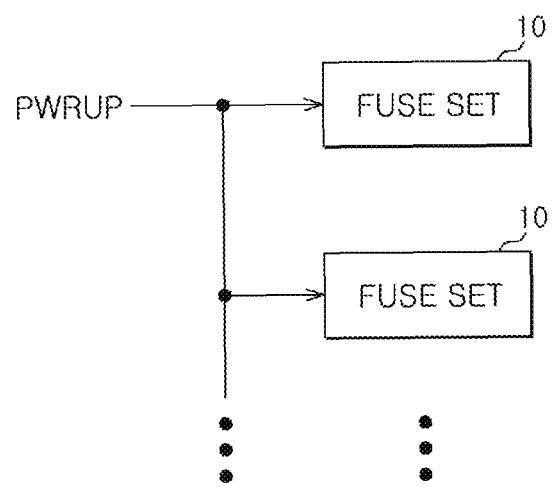
FIG. 1 is a schematic block diagram of conventional fuse sets.
Figure 2:
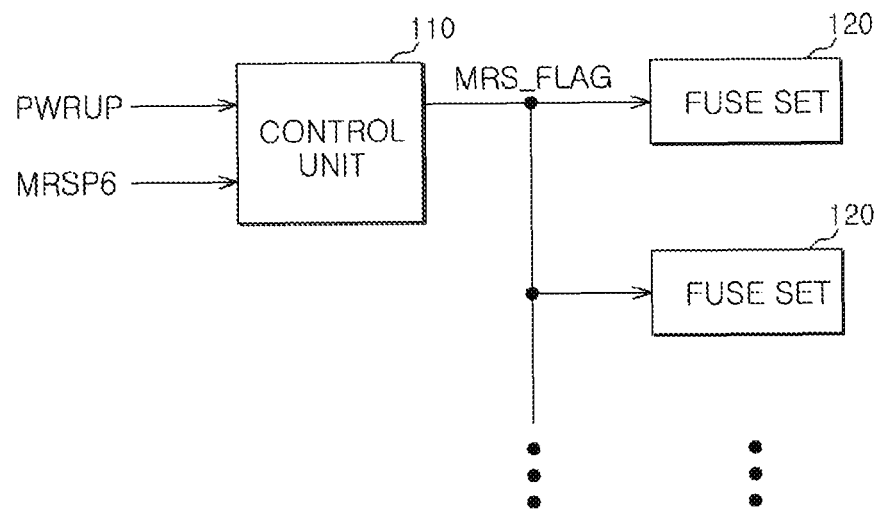
FIG. 2 is a schematic block diagram of an exemplary fuse circuit for a semiconductor integrated circuit according to one embodiment.

FIG. 2 is a schematic block diagram of an exemplary fuse circuit 100 for a semiconductor integrated circuit according to one embodiment. In FIG. 2, the fuse circuit 100 for a semiconductor integrated circuit can be configured to include a control unit 110 and a plurality of fuse sets 120.

The control unit 110 can be configured to combine a power-up signal 'PWRUP' and a command pulse signal 'MRSP6' to generate a fuse set control signal 'MRS_FLAG'. Here, the command pulse signal 'MRSP6' can be a pulse signal generated according to a mode register set (MRS) command signal input from a chip set disposed at an exterior of the semiconductor integrated circuit.

If the fuse set control signal 'MRS_FLAG', and not the power-up signal 'PWRUP', is activated, then the plurality of fuse sets 120 can be configured to operate when a power supply voltage VDD is supplied to internal fuses of the fuse sets 120.

Figure 3:
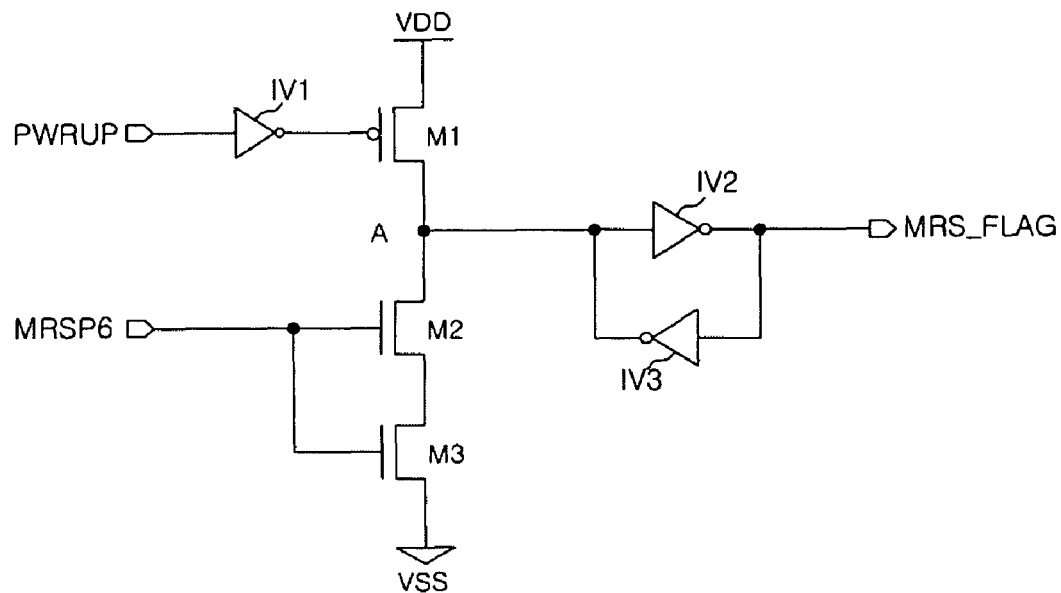
FIG. 3 is a schematic circuit diagram of an exemplary control unit capable of being implemented in the circuit of FIG. 2 according to one embodiment.

FIG. 3 is a schematic circuit diagram of an exemplary control unit 110 capable of being implemented in the circuit of FIG. 2 according to one embodiment. In FIG. 3, the control unit 110 can include first to third inverters IV1 to IV3 and first to third transistors M1 to M3. The first inverter IV1 can be configured to receive the power-up signal 'PWRUP'. The first transistor M1 can be configured to have a source terminal receiving a power supply voltage, a gate terminal receiving an output of the first inverter IV1, and a drain terminal connected to a node (A). The second transistor M2 can be configured to have a drain terminal connected to the node (A) and a gate terminal receiving the command pulse signal 'MRSP6'. The third transistor M3 can be configured to have a drain terminal connected to the source terminal of the second transistor M2, a source terminal connected to ground, and a gate terminal receiving the command pulse signal 'MRSP6'. The second and third inverters IV2 and IV3 can be configured to latch the output signal level on the node (A) and to output the fuse set control signal 'MRS_FLAG'.

In FIG. 3, if the command pulse signal 'MRSP6' is not activated after the power-up signal 'PWRUP' is activated, then the output of the second inverter IV2 of the control unit 110 can be maintained at a low level. Accordingly, the control unit 110 can maintain the fuse set control signal 'MRS_FLAG' in an inactive state. If the command pulse signal 'MRSP6' is activated after the power-up signal 'PWRUP' is activated, then the output of the second inverter IV2 of the control unit 110 can be transitioned from the low level to a high level, and can be maintained at the transitioned high level. Thus, the control unit 110 can maintain the fuse set control signal 'MRS_FLAG' in an active state.

Since the control unit 110 can operate according to a pulse signal, the control unit 110 can function in response to the command pulse signal 'MRSP6'. Alternatively, a control unit 110 may also be configured to directly use the command pulse signal 'MRSP6' through a slight circuit design modification.

Figure 4:
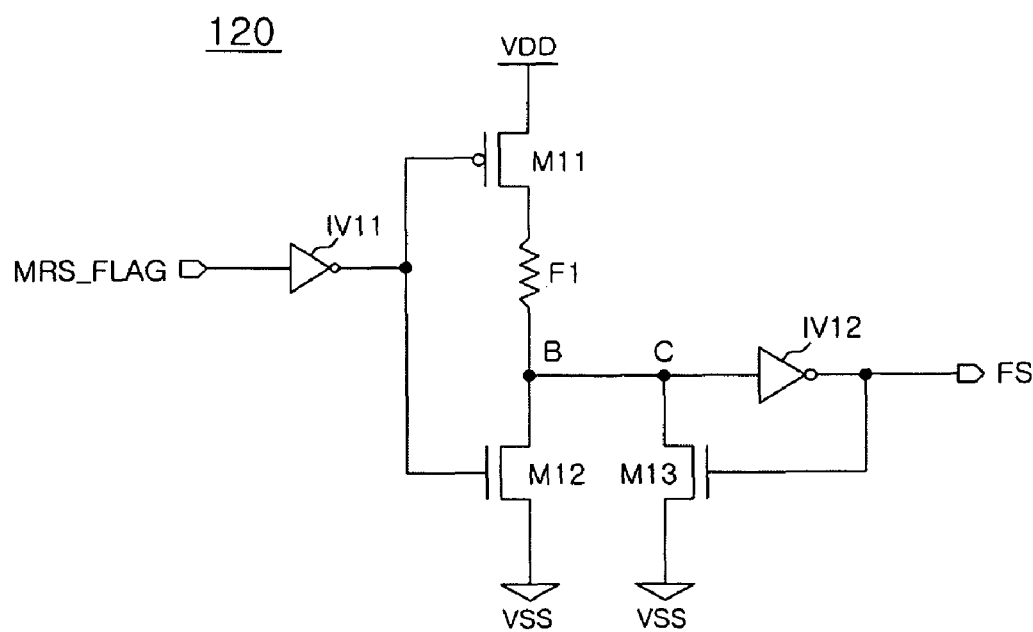
FIG. 4 is a schematic circuit diagram of an exemplary fuse set capable of being implemented in the circuit of FIG. 2 according to one embodiment.

FIG. 4 is a schematic circuit diagram of an exemplary fuse set 120 capable of being implemented in the circuit of FIG. 2 according to one embodiment. In FIG. 4, the fuse set 120 can be configured to include first and second inverters IV11 and IV12, first to third transistors M11 to M13, and a fuse F1.

The first inverter IV11 can be configured to receive the fuse set control signal 'MRS_FLAG'. The first transistor M11 can be configured to have a gate terminal receiving an output of the first inverter IV11, a source terminal to which a power supply voltage VDD is supplied, and a drain terminal connected to one end of the fuse F1. The other end of the fuse F1 can be connected to a node (B).

The second transistor M12 can have a gate terminal receiving the output of the first inverter IV11, a source terminal that can be grounded, and a drain terminal connected to the node (B). The second inverter IV12 can have an input terminal connected to a node (C) and an output terminal through which a fuse set signal 'FS' can be output. The third transistor M13 can have a gate terminal receiving the output of the second inverter IV12, a source terminal that can be grounded, and a drain terminal connected to the node (C).

In FIG. 4, the fuse set 120 is an example to output a one bit signal. However, and the fuse set 120 may be configured by using a plurality of individual fuse structures, according to a total number of bits of a signal to be output.

An exemplary operation of the fuse circuit will be described with reference to FIGS. 3 and 4.

When a physical test, such as the temperature and humidity stress test, is performed, a power supply voltage VDD is supplied to the semiconductor integrated circuit. If the power supply voltage VDD exceeds a predetermined level, the power-up signal 'PWRUP' is activated to the high level. Here, when the physical test is performed, the MRS command signal may not be issued. Thus, a command pulse signal 'MRSP6' may not be generated.

In FIG. 3, if the power-up signal 'PWRUP' is activated to the high level in the control unit 110, then the output of the second inverter IV2 can become the low level. Accordingly, the fuse set control signal 'MRS_FLAG' can be initialized to a low level.

Since the command pulse signal 'MRSP6' is not generated, the output of the second inverter IV2 can continue to be maintained at the low level, and the fuse set control signal 'MRS_FLAG' can be maintained in the inactive state at the low level.

In FIG. 4, since the fuse set control signal 'MRS_FLAG' is in the inactive state at the low level, the power supply voltage VDD is not supplied to the fuse F1. Accordingly, even though the temperature and humidity stress test is performed to create high temperature and humidity environments, the power supply voltage VDD is not supplied to the fuse F1. Thus, it is possible to prevent operational problems, such as a fault of a current standard IDD2P, for a semiconductor integrated circuit, as well as creating a current leakage path due to an abnormal increase in the resistance of the fuse F1.

During normal operation and operational tests, except for the physical tests, if the power supply voltage VDD exceeds the predetermined level, the power-up signal 'PWRUP' can be activated to the high level. After the power-up signal 'PWRUP' is activated, the MRS command signal can be issued at a predetermined timing, whereby the command pulse signal 'MRSP6' can be generated.

In FIG. 3, if the power-up signal 'PWRUP' is activated to the high level in the control unit 110, then the output of the second inverter IV2 can be initialized at the low level. Accordingly, the fuse set control signal 'MRS_FLAG' can be inactivated to the low level. Since the command pulse signal 'MRSP6' is generated after the power-up signal 'PWRUP' is activated, the output of the second inverter IV2 can be transitioned to the high level and the fuse set control signal 'MRS_FLAG' can be activated to the high level.

In FIG. 4, since the fuse set control signal 'MRS_FLAG' is in the active state at the high level, the first transistor M1 can be turned ON. If the fuse F1 is not cut OFF (is in a conductive state), then the level of the power supply voltage VDD can be supplied to the second inverter IV12 through the first transistor M1. Accordingly, the output of the second inverter IV12 can become the low level and the fuse set signal 'FS' can be output at the low level.

Conversely, if the fuse F1 is cut OFF (is in a non-conductive state), then the fuse set control signal 'MRS_FLAG' can be in the initial state, i.e., at the low level. Accordingly, the output of the second inverter IV12 can be maintained at the high level. As a result, the fuse set signal 'FS' can be output at the high level.

Thus, the fuse set can normally operate during the operational tests and the normal operation of the semiconductor integrated circuit, similar to existing fuse sets.

While certain embodiments have been described above, it will be understood that the embodiments described are by way of example only. Accordingly, the device and methods described herein should not be limited based on the described embodiments. Rather, the device and methods described herein should only be limited in light of the claims that follow when taken in conjunction with the above description and accompanying drawings.

What is claimed is:

1. A fuse circuit for a semiconductor integrated circuit, comprising:
    a control unit configured to activate a fuse set control signal in response to an external command signal; and
    a plurality of fuse sets, each configured so that power is supplied to internal fuses in response to the activation of the fuse set control signal,
    wherein the control unit is configured to inactivate the fuse set control signal when the external command signal is not inputted and a power-up signal is activated.

2. The fuse circuit for a semiconductor integrated circuit of claim 1, wherein the external command signal includes a mode register set (MRS) command signal.

3. The fuse circuit for a semiconductor integrated circuit of claim 1, wherein each of the plurality of fuse sets includes:
    a fuse;
    a first switching element configured to supply the power to the fuse in response to activation of the fuse set control signal; and
    a second switching element configured to connect the fuse to a ground in response to inactivation of the fuse set control signal.

4. A fuse circuit for a semiconductor integrated circuit, comprising:
    a control unit configured to determine whether a physical test is being performed to activate a fuse set control signal; and
    a plurality of fuse sets, each configured so that power is supplied to internal fuses in response to activation of the fuse set control signal,
    wherein the control unit is configured to inactivate the fuse set control signal when an external command signal is not inputted and a power-up signal is activated.

5. The fuse circuit for a semiconductor integrated circuit of claim 4, wherein the physical test is a test in which the external command signal is not input to the semiconductor integrated circuit and only the power is supplied thereto.

6. The fuse circuit for a semiconductor integrated circuit of claim 4, wherein the external command signal includes a mode register set (MRS) command signal.

7. The fuse circuit for a semiconductor integrated circuit of claim 4, wherein each of the plurality of fuse sets includes:
    a fuse;
    a first switching element configured to supply the power to the fuse in response to the activation of the fuse set control signal; and
    a second switching element configured to connect the fuse to a ground in response to the inactivation of the fuse set control signal.

8. A control method of a fuse circuit for a semiconductor integrated circuit, comprising:
    determining an operational mode of the semiconductor integrated circuit; and
    interrupting power supply to fuses provided inside the fuse circuit when an external command signal is not inputted and a power-up signal is activated,
    wherein the operational mode of the semiconductor integrated circuit includes a physical test mode.

9. The control method of a fuse circuit for a semiconductor integrated circuit of claim 8, wherein the physical test mode includes a test mode in which the external command signal is excluded from input to the semiconductor integrated circuit and only power is supplied thereto.

10. The control method of a fuse circuit for a semiconductor integrated circuit of claim 8, wherein the determining of the operational mode is performed by using whether or not a mode register set (MRS) command signal has been input to the semiconductor integrated circuit as the external command signal.

* * * * *